United States Patent
Watanabe et al.

(10) Patent No.: US 10,356,969 B2
(45) Date of Patent: Jul. 16, 2019

(54) COMPONENT MOUNTER

(71) Applicant: Panasonic Intellectual Property Management Co., Ltd., Osaka (JP)

(72) Inventors: Koji Watanabe, Yamanashi (JP); Hiroyuki Fujiwara, Yamanashi (JP); Shinji Yamamoto, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 192 days.

(21) Appl. No.: 15/297,714

(22) Filed: Oct. 19, 2016

(65) Prior Publication Data
US 2017/0257991 A1    Sep. 7, 2017

(30) Foreign Application Priority Data
Mar. 1, 2016 (JP) .................. 2016-038508

(51) Int. Cl.
*H05K 13/04* (2006.01)
*H05K 13/08* (2006.01)

(52) U.S. Cl.
CPC ..... *H05K 13/0417* (2013.01); *H05K 13/0408* (2013.01); *H05K 13/0419* (2018.08); *H05K 13/08* (2013.01); *H05K 13/0812* (2018.08)

(58) Field of Classification Search
CPC ........ H05K 3/30; H05K 13/02; H05K 13/021; H05K 13/04; H05K 13/0409; H05K 13/0417; H05K 13/08; H05K 13/081; H05K 13/0408; H05K 13/0812
See application file for complete search history.

(56) References Cited

U.S. PATENT DOCUMENTS

| | | | | |
|---|---|---|---|---|
| 5,743,005 | A * | 4/1998 | Nakao ................ | H05K 13/0812 29/833 |
| 6,631,552 | B2 * | 10/2003 | Yamaguchi ............ | H05K 13/08 29/739 |
| 7,220,095 | B2 * | 5/2007 | Lyndaker ........... | H05K 13/0419 414/810 |

FOREIGN PATENT DOCUMENTS

| | | |
|---|---|---|
| JP | 2003-168890 A | 6/2003 |
| JP | 2004-119681 A | 4/2004 |
| JP | 2005101586 A * | 4/2005 |
| JP | 2009-170833 | 7/2009 |
| JP | 2010-050338 A | 3/2010 |
| JP | 2011171664 A * | 9/2011 |

* cited by examiner

*Primary Examiner* — Carl J Arbes
(74) *Attorney, Agent, or Firm* — Pearne & Gordon LLP

(57) ABSTRACT

A recognition mark which is formed on a tape retaining cover which retains a carrier tape, which holds components in pockets, in relation to a sprocket with which the tape feeder is provided, and the component or the pocket which is positioned at a suction position through an opening which is formed in the tape retaining cover are recognized. Based on recognition results, tape feed positional correction for positioning the suction target component at the suction position is performed such that the component, which is adjacent on an upstream side in a tape feed direction to the component which is positioned at the suction position, is not exposed by greater than or equal to a predetermined amount from the opening.

4 Claims, 7 Drawing Sheets

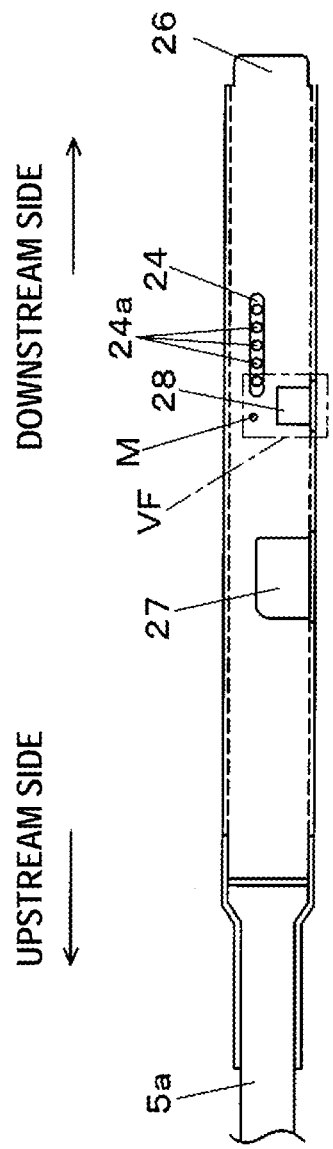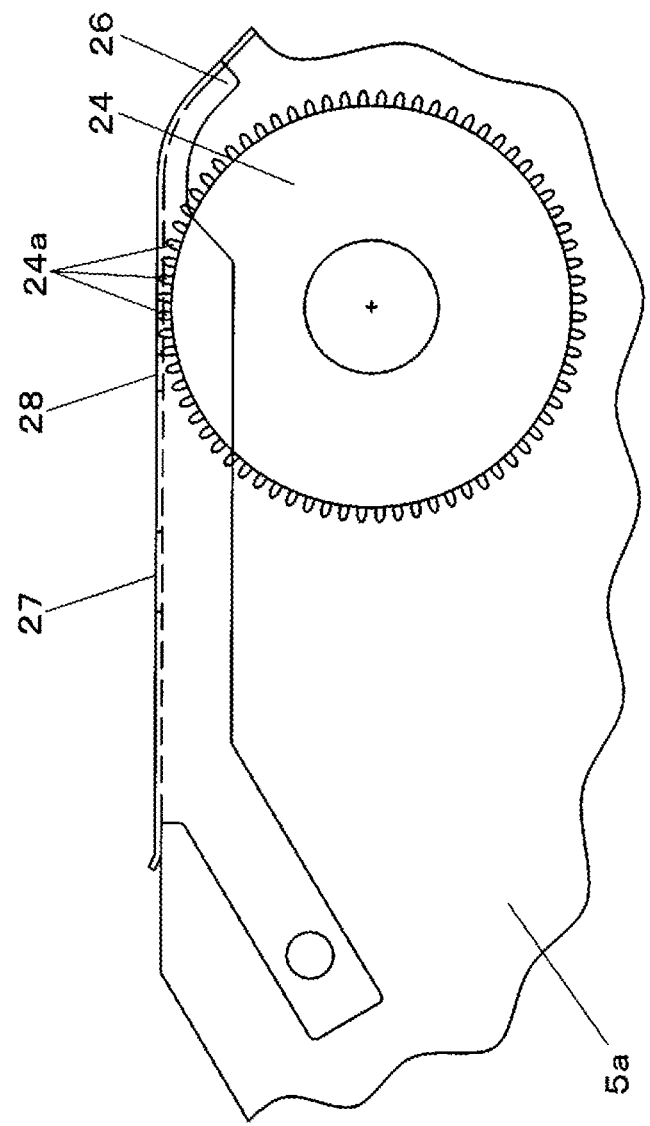
FIG. 4A
FIG. 4B

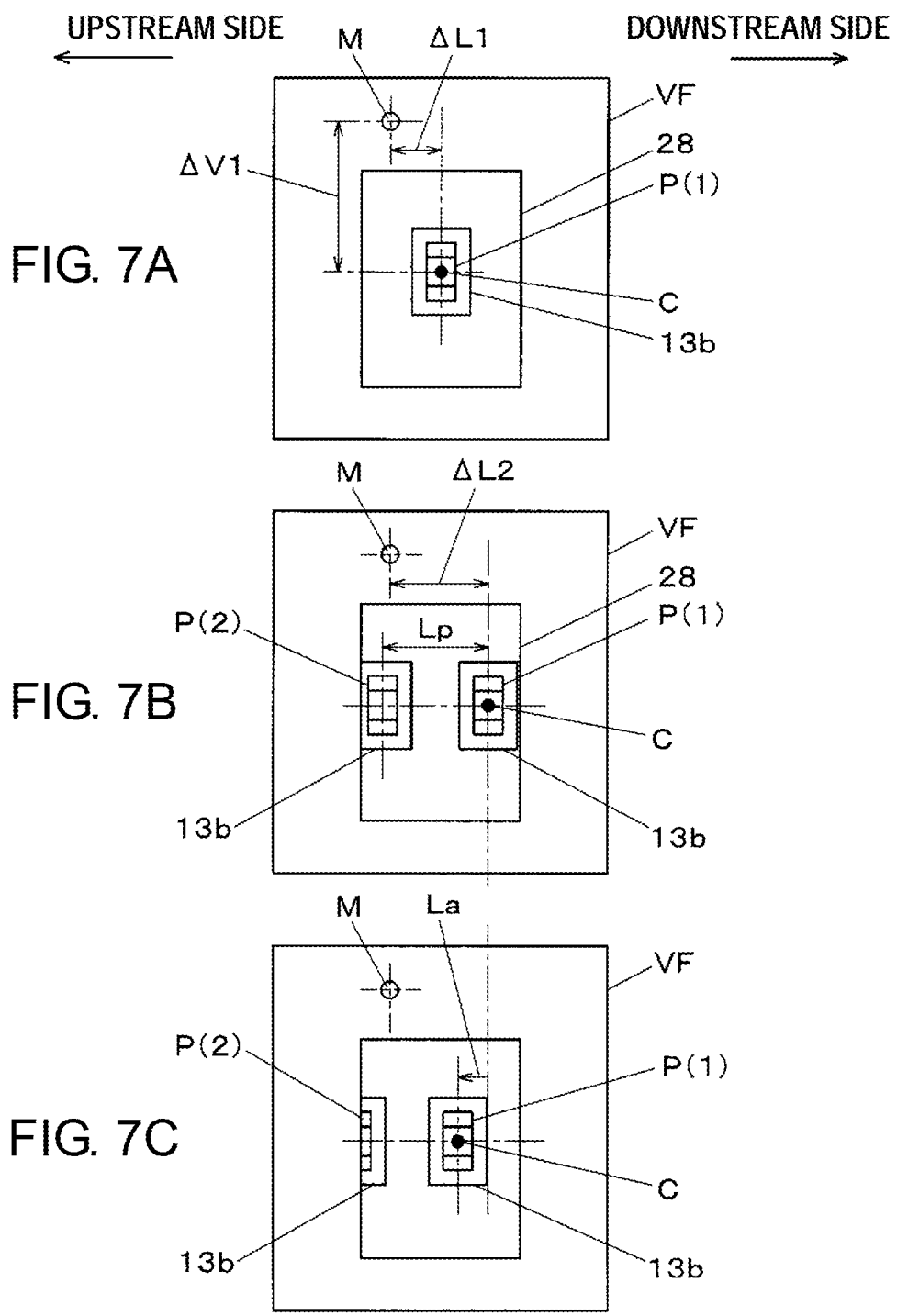

COMPONENT MOUNTER

BACKGROUND

1. Technical Field

The present disclosure relates to a component mounter and a component mounting method for picking up a component with a suction nozzle to mount the component onto a board.

2. Description of the Related Art

In the related art, tape feeders for feeding a carrier tape in which components are stored in pockets (component holding holes) are widely used as component suppliers for supplying components to component mounters. Since the tape feeder engages pins of a sprocket with tape feeding feed holes which are formed in the carrier tape, the tape feeder is provided with a tape retaining cover which covers the carrier tape from above such that the components do not fall out from the pockets while the carrier tape, from which the cover tape is peeled, is fed to a component pick up position (for example, PTL 1).

An opening which exposes the components is provided in the tape retaining cover at the component pick up position at which the components are sucked by the suction nozzle which is provided on the mounting head. Generally, the tape feeder and the tape retaining cover which is provided thereon are formed in shapes which may be used in common for a plurality of differently sized components, and the size and shape of the opening for sucking the components is set to match the largest among the differently sized components.

CITATION LIST

Patent Literature

PTL 1: Japanese Patent Unexamined Publication No. 2009-170833

SUMMARY

A component mounter of the disclosure includes a tape feeder provided with a sprocket which feeds a carrier tape which holds components in pockets, a tape retaining cover which retains the carrier tape toward the sprocket, an opening, which is formed in the tape retaining cover, for sucking the components, and a recognition mark which is formed on the tape retaining cover and serves as a reference for recognizing a suction position of the components, a mounting head which mounts the components which are supplied from the tape feeder onto a mounting target, a recognition camera which recognizes the recognition mark and the component or the pocket which is positioned at the suction position through the opening, and a tape feed position corrector which, based on recognition results of the recognition camera, performs tape feed positional correction in which one of the components as a suction target is positioned in the suction position such that another of the components, which is adjacent on an upstream side in a tape feed direction to the one of the components to be positioned in the suction position, is not exposed by greater than or equal to a predetermined amount from the opening.

A component mounting method of the disclosure includes recognizing a recognition mark which is formed on a tape retaining cover which retains a carrier tape, which holds components in pockets, toward a sprocket with which a tape feeder is provided, and one of the components or one of the pockets which are positioned at a suction position through an opening which is formed in the tape retaining cover, and performing tape feed positional correction in which, based on recognition results, one of the components as a suction target is positioned in the suction position such that another of the components, which is adjacent on an upstream side in a tape feed direction to the one of the components to be positioned in the suction position, is not exposed by greater than or equal to a predetermined amount from the opening.

According to the disclosure, it is possible to prevent a component following the component which is positioned at the suction position from being exposed from the opening and falling out.

BRIEF DESCRIPTION OF THE DRAWINGS

FIG. 3A is an explanatory diagram of the configuration of the tape feeder, FIG. 3B is an explanatory diagram of the structure of a carrier tape, and FIG. 3C is an enlarged diagram of the vicinity of a suction position of a component of the tape feeder;

FIGS. 4A and 4B are explanatory diagrams of the structure of a tape retaining cover of the tape feeder of an exemplary embodiment of the disclosure, where FIG. 4A is a top surface diagram and FIG. 4B is a side surface diagram;

FIG. 5A is a block diagram illustrating the configuration of the control system of the component mounter, and FIG. 5B is a block diagram illustrating the configuration of the control system of the tape feeder;

FIGS. 7A to 7C are diagrams describing the tape feed positional correction method in the tape feeder of an exemplary embodiment of the disclosure, where FIG. 7A is a diagram illustrating one example, FIG. 7B is a diagram illustrating another example, and FIG. 7C is a diagram illustrating still another example.

DETAILED DESCRIPTION

Before describing the exemplary embodiment of the disclosure, a concise description will be given of the problems in the related art. Since the opening which is formed in the tape retaining cover is set to match the largest of the different sized components, in a case in which the tape feeder supplies a comparatively small component among the different sized components, in addition to the component which is positioned at the suction position, a portion of the following component to be sucked may also be exposed. In this case, there is a concern that the tape retaining cover will not effectively retain the following component to be sucked, and the following component to be sucked will fall out from the pocket due to vibration or the like during the suction of the component which is positioned at the suction position.

The disclosure provides a component mounter and a component mounting method which are capable of preventing a component following the component which is positioned at the suction position from being exposed from the opening and falling out.

Figure 1:
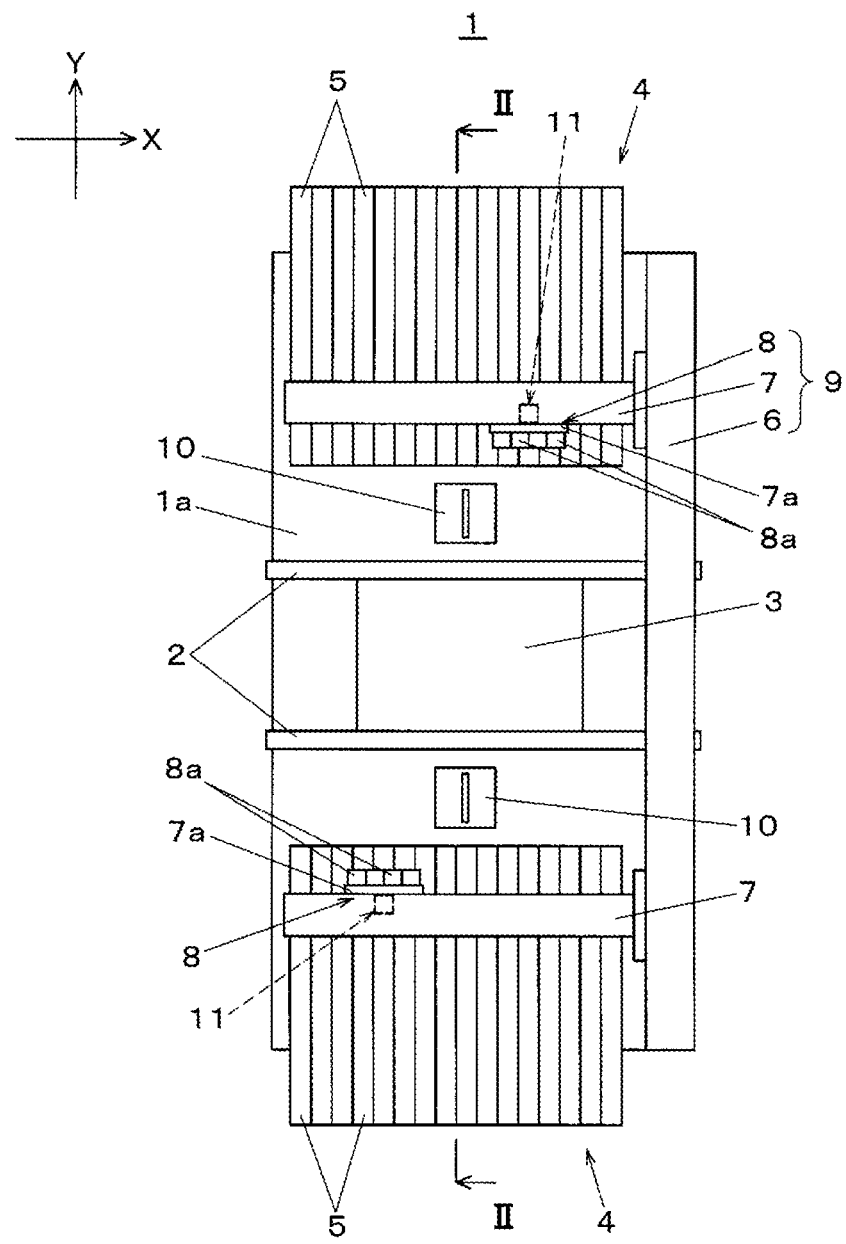
FIG. 1 is a plan view of a component mounter of an exemplary embodiment of the disclosure.
Figure 2:
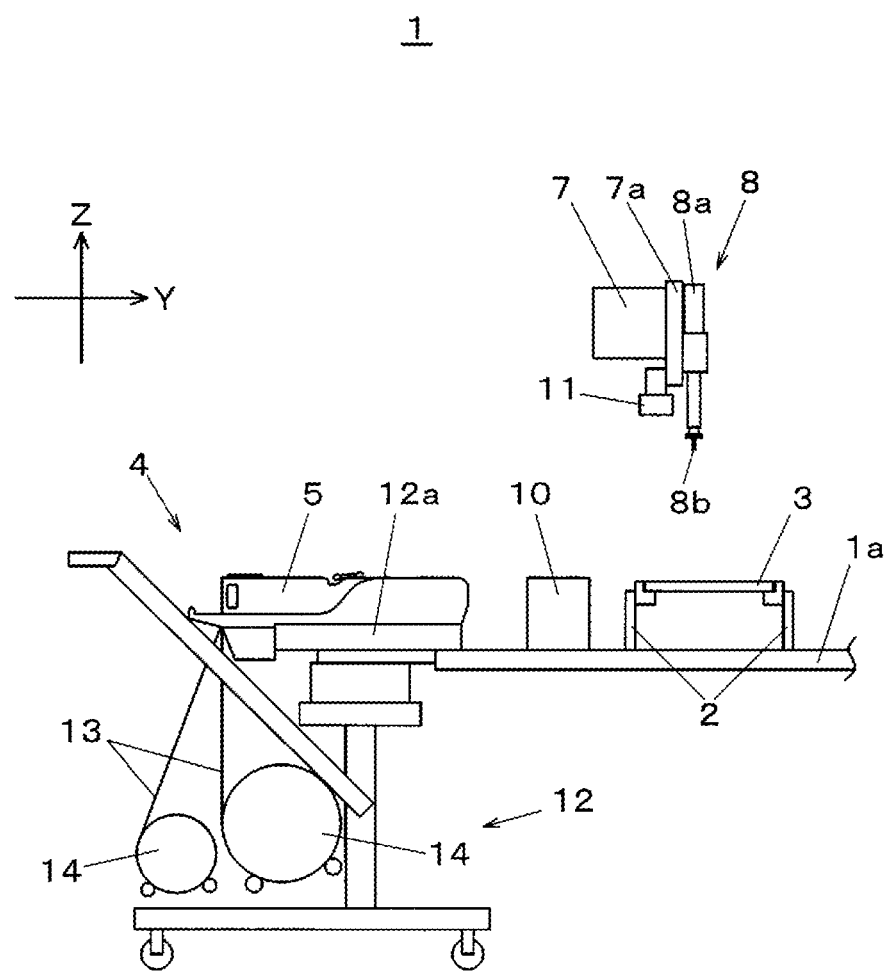
FIG. 2 is a partial sectional diagram of the component mounter of an exemplary embodiment of the disclosure.

Hereinafter, detailed description will be given of an exemplary embodiment of the disclosure using the drawings. The configurations, forms, and the like described hereinafter are examples to facilitate explanation, and may be modified, as appropriate, according to the design of the component mounter and the tape feeder. Hereinafter, elements corresponding to each other are given the same symbols in all of the drawings, and duplicated description is omitted. In FIG. 1 and some parts described later, an X direction (the left-right direction in FIG. 1) in the board transport direction and a Y direction (the up-down direction in FIG. 1) perpendicular to the board transport direction are illustrated as two axial directions which orthogonally intersect each other in a horizontal plane. In FIG. 2 and some parts described later, a Z direction is illustrated as a height direction which is perpendicular to the horizontal plane. The Z direction is the up-down direction or a perpendicular direction in a case in which the component mounting system is installed on the horizontal plane.

First, description will be given of component mounter 1 with reference to FIGS. 1 and 2. FIG. 2 partially illustrates the cross-section taken along line II-II in FIG. 1. Component mounter 1 includes a function of mounting components onto a board. In FIG. 1, transport mechanism 2 is arranged in the X direction at the middle of table 1a. Transport mechanism 2 transports board 3 which is carried in from the upstream side, and positions and holds board 3 in a position for executing component mounting work. Component supplier 4 is disposed on each side of transport mechanism 2. A plurality of tape feeders 5 are disposed to line up on each component supplier 4. Tape feeder 5 supplies a component to a suction position of a mounting head of a component mounting mechanism (described later) by pitch feeding a carrier tape storing components in a tape feed direction.

Y-axis beam 6 which is provided with a linear drive mechanism is arranged along the Y direction on the end of one side on the top surface of table 1a in the X direction. Two X-axis beams 7 similarly provided with linear drive mechanisms are joined to Y-axis beam 6 to move freely in the Y direction. X-axis beams 7 are arranged parallel to the X direction. Mounting head 8 is installed on each of two X-axis beams 7 to move freely in the X direction. As illustrated in FIG. 2, mounting head 8 is provided with a plurality of suction units 8a which are capable of sucking components to hold, lift, and lower the components. Suction nozzle 8b is provided on the tip of each suction unit 8a.

Mounting head 8 moves in the X direction and the Y direction due to Y-axis beam 6 and X-axis beam 7 being driven. Accordingly, using suction nozzles 8b, two mounting heads 8 suck and pick up components from the suction positions of tape feeders 5 disposed on component suppliers 4 corresponding to each mounting head 8, and mount the components onto mounting points on board 3 which is positioned in transport mechanism 2. Y-axis beam 6, X-axis beams 7, and mounting heads 8 form component mounting mechanism 9 which mounts components onto board 3 by moving mounting heads 8 which hold components. Mounting head 8 sucks the component which is supplied from tape feeder 5 using suction nozzle 8b and mounts the component on a mounting target such as board 3.

Component recognition camera 10 is arranged between component supplier 4 and transport mechanism 2. When mounting head 8 which picks up the component from component supplier 4 moves above component recognition camera 10, component recognition camera 10 images the component in the state of being held by mounting head 8 and recognizes the holding posture of the component. Board recognition camera 11 is attached to plate 7a to which mounting head 8 is attached, and moves integrally with mounting head 8.

Due to the movement of mounting head 8, board recognition camera 11 moves above board 3 which is positioned in transport mechanism 2, and board recognition camera 11 images a board mark (not illustrated) which is provided on board 3 to recognize the position of board 3. Board recognition camera 11 moves above the suction position of the component of tape feeder 5 and recognizes the state of the carrier tape in the vicinity of the suction position. In a component mounting operation to board 3 carried out by mounting head 8, mounting position correction is performed, taking into account the recognition results of the component by component recognition camera 10 and the recognition results of the board position by board recognition camera 11.

In FIG. 2, component supplier 4 is configured to include carriage 12 which is attachable and detachable to table 1a, in which a plurality of tape feeders 5 are installed on feeder base 12a in advance. Supply reels 14 storing carrier tapes 13 in a wound state are held in carriage 12, and carrier tapes 13 hold the components. Carrier tapes 13 which are pulled out from supply reels 14 are installed on tape feeders 5. Tape feeders 5 pitch feed carrier tape 13 to the suction position of suction nozzles 8b.

Figure 3A:
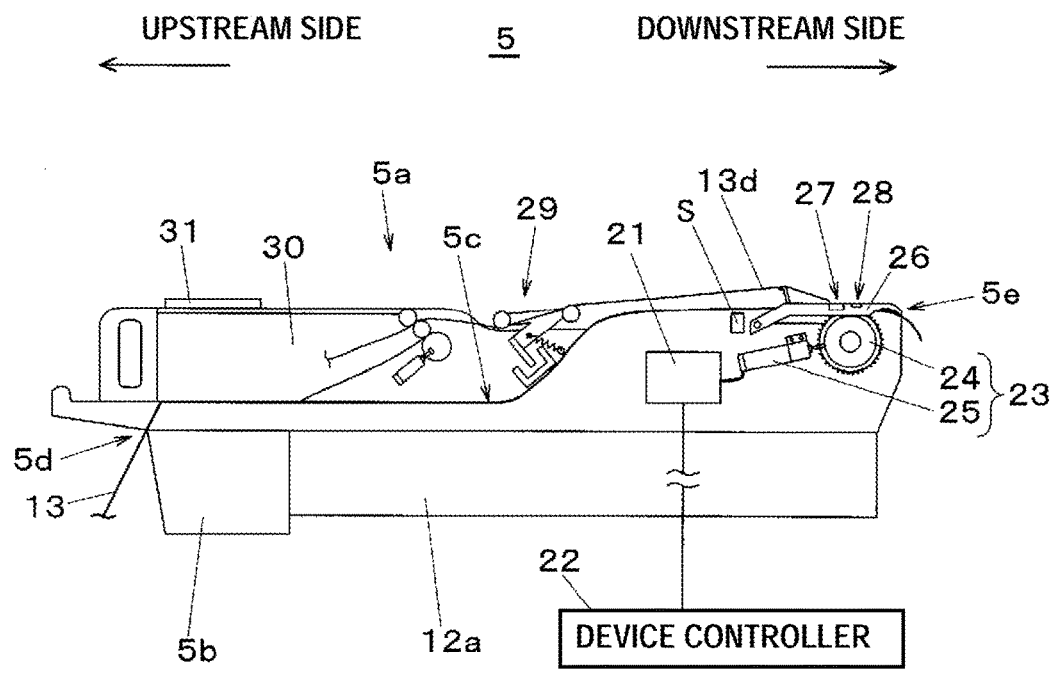
FIGS. 3A to 3C are diagrams illustrating a tape feeder of an exemplary embodiment of the disclosure, where

Next, description will be given of the configuration and functions of tape feeder 5, with reference to FIGS. 3A to 4B. Tape feeder 5 has a function of transporting carrier tape 13, which stores the components and is covered by a cover tape, to the suction position, and peeling off the cover tape before the suction position to supply the stored components. As illustrated in FIG. 3A, tape feeder 5 is configured to include main body 5a, and installation portion 5b provided to protrude downward from the bottom surface of main body 5a. Tape feeder 5 is mounted to feeder base 12a by installing installation portion 5b on feeder base 12a in a state in which the bottom surface of main body 5a is parallel to feeder base 12a.

Due to tape feeder 5 being installed on feeder base 12a, feeder controller 21 which is embedded in tape feeder 5 is electrically connected to device controller 22 of component mounter 1. Feeder controller 21 controls the tape feed operation of carrier tape 13. Tape transport path 5c is provided on the inside of main body 5a. Tape transport path 5c guides carrier tape 13 which is pulled out from supply reel 14 and inserted into main body 5a. Tape transport path 5c is provided to communicate from insertion port 5d to output port 5e. Insertion port 5d is opened at the end of the upstream side of main body 5a in the tape feed direction (hereinafter referred to simply as the "upstream side", and the opposite direction is referred to as the "downstream side"), and carrier tape 13 is inserted through insertion port 5d. Output port 5e is opened on the downstream side of the suction position at which mounting head 8 sucks and picks up the components.

Figure 3B:
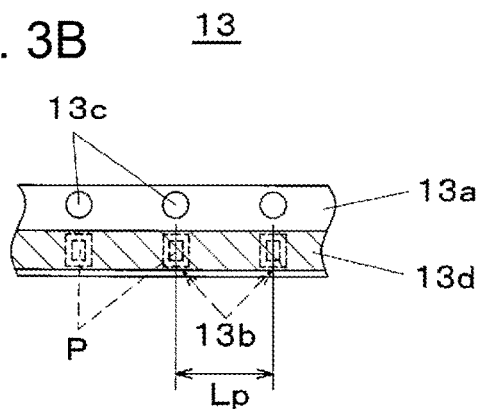
Figure 3C:
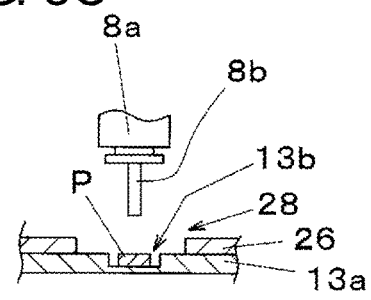

Carrier tape 13 in FIGS. 3B and 3C is provided with base tape 13a which forms the tape body, and cover tape 13d. Pockets 13b which store and hold components P, and feed holes 13c for pitch feeding carrier tape 13 are formed in base tape 13a. Feed holes 13c are provided at a predetermined pitch. Pockets 13b are provided at pitch Lp in the pitch feed direction. Cover tape 13d is bonded to the top surface of base tape 13a so as to cover pockets 13b in order to prevent components P from falling out from pockets 13b.

Tape feed mechanism 23 for pitch feeding carrier tape 13 is provided on main body 5a in FIG. 3A. Tape feed mechanism 23 includes sprocket 24 which an axial line is perpendicular to the tape feed direction, and drive mechanism 25 which rotationally drives sprocket 24. Sprocket 24 is provided at the end on the downstream side of main body 5a in a horizontal posture. A plurality of feed pins 24a (refer to FIG. 4) are formed on the outer circumference of sprocket 24. Drive mechanism 25 pitch feeds carrier tape 13 along tape transport path 5c by driving feed pins 24a in a state in which feed pins 24a are engaged with feed holes 13c of carrier tape 13. Tape feed mechanism 23 is controlled by feeder controller 21. In other words, drive mechanism 25 is sprocket driving means (sprocket driver) for rotationally driving sprocket 24.

In FIGS. 3A, 3C, 4A, and 4B, tape retaining cover 26 is arranged on the top surface side of main body 5a in the vicinity of sprocket 24. A portion of feed pins 24a of sprocket 24 is exposed from tape retaining cover 26. Cover tape peeler 27 for peeling off cover tape 13d is provided on tape retaining cover 26. Opening 28 which corresponds to the suction position of suction nozzle 8b is provided on the downstream side of cover tape peeler 27 of tape retaining cover 26.

The shape of opening 28 is set to a size at which suction nozzle 8b is capable of sucking and picking up component P of the maximum size supplied by carrier tape 13 which may be installed in tape feeder 5. In FIG. 4A, recognition mark M is formed within imaging visual field VF of board recognition camera 11 which images opening 28 in the vicinity of opening 28 of the top surface of tape retaining cover 26. Recognition mark M serves as a reference for recognizing the suction position of component P which is sucked by suction nozzle 8b.

In this manner, tape feeder 5 is provided with sprocket 24 which feeds carrier tape 13 which holds components P in pockets 13b, tape retaining cover 26 which retains carrier tape 13 toward sprocket 24, an opening (opening 28) formed in tape retaining cover 26 for sucking components P, and recognition mark M which is formed on tape retaining cover 26 and serves as a reference for recognizing the suction position of components P.

In FIG. 3A, carrier tape 13 is pitch fed in a state of being retained in tape transport path 5c by tape retaining cover 26. In the process in which carrier tape 13 runs under tape retaining cover 26, cover tape 13d is folded back by cover tape peeler 27 and pulled out to the upstream side, and thus, cover tape 13d is peeling off from base tape 13a at the upstream side of the component pick up position. Accordingly, component P inside pocket 13b is exposed at the top in opening 28, and assumes a state in which suction nozzle 8b is capable of picking up component P. Peeled off cover tape 13d is guided to the opposite side from the pitch feed direction by cover tape feed mechanism 29, and is fed into tape collector 30 which is provided on the upstream side of main body 5a.

In FIG. 3A, operation and display panel 31 which is disposed on the top surface of the upstream side of tape feeder 5 is connected to feeder controller 21. Various types of operation button are provided on operation and display panel 31. Examples of operation buttons are for operating a tape feed operation and a tape return operation carried out by tape feed mechanism 23, and a cover tape feed operation carried out by cover tape feed mechanism 29. Display means such as a liquid crystal display, a seven-segment LED, or the like which displays the operational state of tape feeder 5 is provided on operation and display panel 31.

Splicing detector S is arranged on the upstream side of the suction position of tape transport path 5c. Splicing detector S is for detecting a splicing location in which the leading carrier tape 13 is spliced to the following carrier tape 13 using a splicing tape in order to supply components P. Splicing detector S is a light transmitting sensor which detects feed holes 13c of carrier tape 13 which is transported, for example, and splicing detector S detects the splicing location due to feed holes 13c being shielded from light by the splicing tape.

Figure 5A:
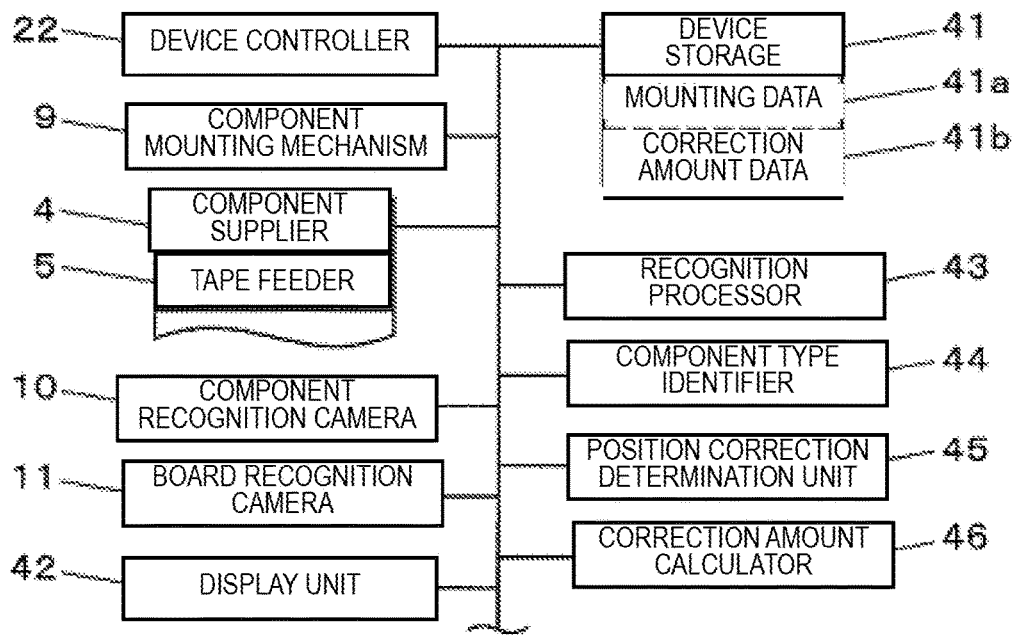
FIGS. 5A and 5B are block diagrams illustrating the configuration of a control system of an exemplary embodiment of the disclosure, where
Figure 5B:
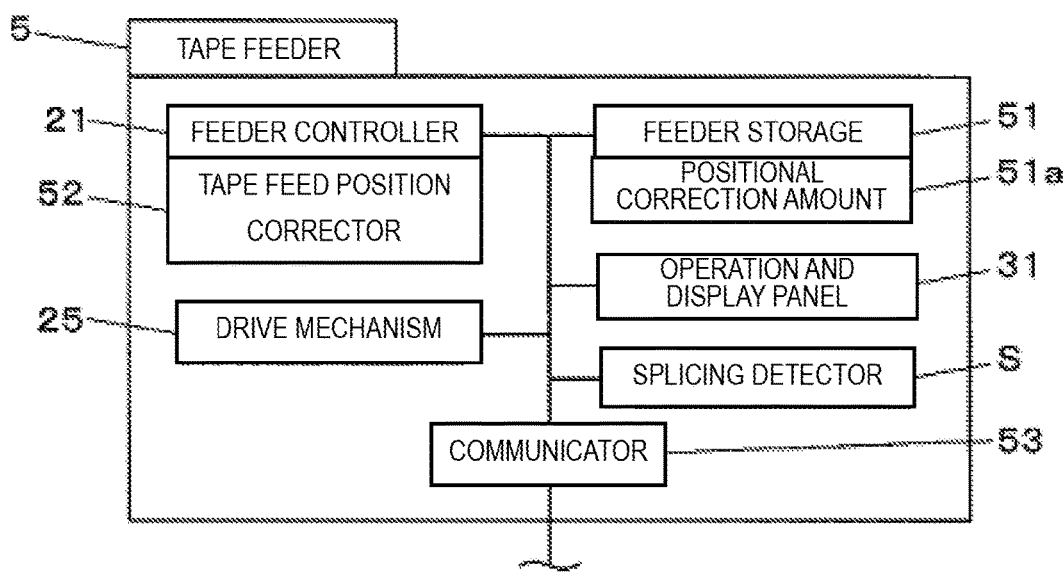

Next, description will be given of the configuration of the control system of component mounter 1 with reference to FIGS. 5A and 5B. FIG. 5A illustrates the overall configuration of component mounter 1, and FIG. 5B illustrates the configuration of tape feeder 5, a plurality of which are installed on each component supplier 4 of component mounters 1. In FIG. 5A, device controller 22 with which component mounter 1 is provided is a computational processing device provided with a CPU function. Device controller 22 controls each of component mounting mechanism 9, component supplier 4, component recognition camera 10, board recognition camera 11, and display unit 42 by executing a processing program which is stored in device storage unit 41. Component mounter 1 is provided with recognition processor 43, component type identifier 44, positional correction determination unit 45, and correction amount calculator 46, which are information processors.

During the control process carried out by device controller 22, various types of production data such as mounting data 41a and correction amount data 41b, which are stored in device storage unit 41, are referred to. Mounting data 41a is data such as the component type of component P to be mounted, and the mounting position coordinates of the board, and mounting data 41a is stored on a per production target board type basis. Recognition processor 43 performs recognition processing on an image of the vicinity of opening 28 of tape feeder 5 which is captured by board recognition camera 11 to detect the position of recognition mark M, component P which is positioned in opening 28 and sucked by suction nozzle 8b, or the position of pocket 13b of carrier tape 13.

Component type identifier 44 identifies the type of component P which is supplied from each tape feeder 5 based on mounting data 41a, and acquires information such as the size of component P, pitch Lp of pockets 13b of carrier tape 13 which holds components P, and the like using a database which is stored by a management computer or the like which is connected to component mounter 1. Positional correction determination unit 45 determines whether or not tape feed positional correction (described later) is necessary based on the position of recognition mark M, the position of component P which is positioned inside opening 28 or pocket 13b of carrier tape 13, the size of component P, and pitch Lp of pockets 13b. The positions of mark M, and component P or pocket 13b are detected by recognition processor 43, and the size of component P and pitch Lp are acquired by component type identifier 44.

Correction amount calculator 46 calculates positional correction amount 51a for correcting the position of component P inside opening 28 based on the position of recognition mark M, the position of component P which is positioned inside opening 28 or pocket 13b of carrier tape 13, the size of component P, and pitch Lp of pockets 13b. The positions of mark M, and component P or pocket 13b are detected by recognition processor 43, and the size of component P and pitch Lp are acquired by component type identifier 44. Correction amount calculator 46 associates the calculated positional correction amount 51*a* with tape feeder 5 to store positional correction amount 51*a* in device storage unit 41 as correction amount data 41*b*, and transmits positional correction amount 51*a* to tape feeders 5 for which tape feed positional correction is necessary.

Display unit 42 displays various display screens, such as the captured image of board recognition camera 11, which are necessary for the execution of the component mounting work of component mounter 1, and notification information relating to predetermined items which are set in advance.

Next, description will be given of the configuration of the control system of tape feeder 5. In FIG. 5B, feeder controller 21 with which tape feeder 5 is provided controls drive mechanism 25 and splicing detector S. Feeder controller 21 controls drive mechanism 25 based on the control signals from component mounter 1 and operational input from operation and display panel 31. Feeder controller 21 is provided with tape feed position corrector 52 as an internal processing function. Feeder controller 21 is connected to device controller 22 of component mounter 1 via communicator 53.

Feeder controller 21 refers to various data such as positional correction amount 51*a*, which is stored in feeder storage unit 51, to perform control. Positional correction amount 51*a* is calculated by correction amount calculator 46 of component mounter 1 and is transmitted to feeder storage unit 51. Positional correction amount 51*a* is a correction value which is necessary during the tape feed positional correction in tape feeder 5. If splicing detector S detects a splicing location of a splicing tape, feeder controller 21 transmits the fact that the splicing location is detected to device controller 22. Tape feed position corrector 52 controls drive mechanism 25 to rotationally drive sprocket 24 to correct the tape feed position based on positional correction amount 51*a*. Accordingly, the stopping position of suction target component P is corrected.

Next, description will be given of the component mounting method (the tape feed positional correction method) which performs the tape feed positional correction in tape feeders 5 with which component mounter 1 is provided, with reference to FIGS. 6 to 7C. The tape feed positional correction is executed at the timing at which carrier tape 13 which is supplied from tape feeder 5 is switched by splicing, in addition to at the timing at which tape feeder 5 which is installed on component supplier 4 is exchanged, and the timing at which carrier tape 13 which is supplied to tape feeder 5 is exchanged. Hereinafter, description will be given of the tape feed positional correction method, exemplifying the timing at which carrier tape 13 which is supplied is switched to the following carrier tape 13 by splicing while continuing the component mounting work.

Figure 6:
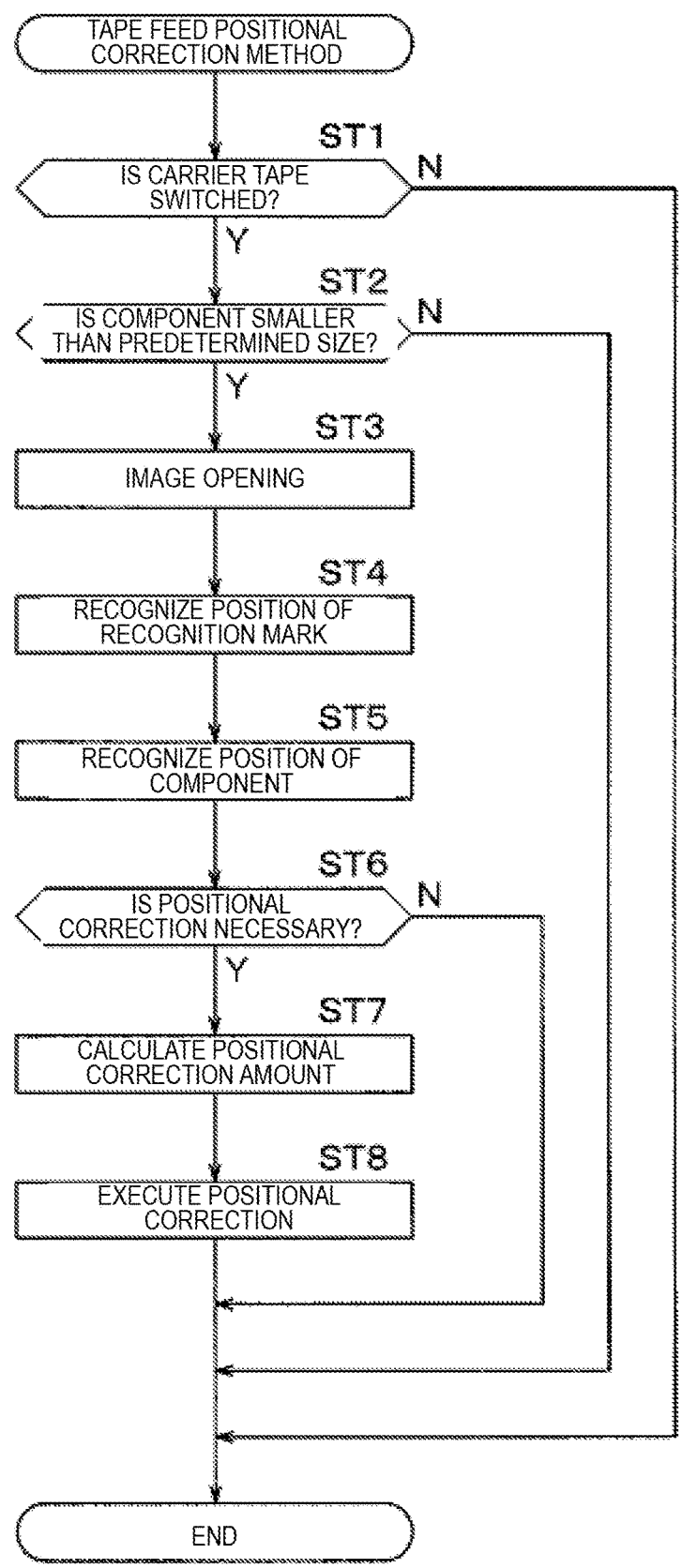
FIG. 6 is a flowchart illustrating a tape feed positional correction method in the tape feeder of an exemplary embodiment of the disclosure.

In FIG. 6, if splicing detector S of tape feeder 5 detects a splicing location (Yes in ST1), feeder controller 21 transmits the fact that the splicing location is detected to device controller 22. Next, component type identifier 44 identifies the type of components P which are held by carrier tape 13 which is switched in, and acquires the size of components P, and pitch Lp of pockets 13*b* of carrier tape 13. Next, positional correction determination unit 45 determines whether or not the size of component P is smaller than a predetermined size at which tape feed positional correction is necessary based on the size of component P and pitch Lp of pockets 13*b* which are acquired (ST2). In a case in which component P is smaller than the predetermined size (Yes in ST2), the tape feed positional correction process described hereinafter is executed.

In other words, in component mounter 1, in a case in which the fact that carrier tape 13 which is supplied from tape feeder 5 is switched to the following carrier tape 13 is detected, the tape feed positional correction process is executed. Accordingly, even if the position of component P of the following carrier tape 13 which is tape fed by splicing is shifted in relation to the leading carrier tape 13, it is possible to execute the tape feed positional correction without requiring operation by a worker.

In component mounter 1, the type of component P which is supplied from tape feeder 5 is identified, and in a case in which it is determined that the type of component P which is supplied from tape feeder 5 is a smaller component than the predetermined size based on the identified results, the tape feed positional correction process is executed. Accordingly, it is possible to execute the tape feed positional correction without requiring the determination of the worker in relation to components P for which tape feed positional correction is necessary. In a case in which a splicing location is not detected (No in ST1), or in a case in which component P is greater than or equal to the predetermined size (No in ST2), the ordinary component mounting work is continued.

In the tape feed positional correction process, device controller 22 images opening 28 using board recognition camera 11 at the timing at which the leading component P which is held by the following carrier tape 13 is pitch fed to opening 28 of the processing target tape feeder 5 (ST3). Next, recognition processor 43 subjects the image which is captured by board recognition camera 11 to the recognition process to recognize the center position of recognition mark M (ST4) and the center position of component P which is positioned inside opening 28 (ST5). The recognition of the center position of component P may be performed from an image of pocket 13*b* which holds component P in a case in which component P is very small. The recognized center position of component P is suction position C of component P which serves as the suction target which is sucked by suction nozzle 8*b*.

In FIGS. 7A to 7C, description will be given of an example of an image of the vicinity of opening 28 which is imaged by board recognition camera 11. FIG. 7A illustrates an example in which component P(1), which is the suction target, is pitch fed to the vicinity of the center of opening 28, and imaging visual field VF includes recognition mark M, component P(1) which is positioned inside opening 28, and pocket 13*b* which holds component P(1). In other words, board recognition camera 11 is a recognition camera which recognizes recognition mark M, and component P(1) or pocket 13*b* which is positioned at suction position C through the opening (opening 28). Recognition processor 43 recognizes and calculates suction position C (position $\Delta L1$ of pitch feed direction, and position $\Delta V1$ perpendicular to the pitch feed direction) of component P(1) as viewed from recognition mark M from the positions of recognition mark M and component P(1) which are recognized by the recognition process.

In FIG. 6, next, positional correction determination unit 45 determines whether or not tape feed positional correction is necessary from suction position C of component P(1) which is recognized, the size of component P, and pitch Lp of pockets 13*b* of carrier tape 13 (ST6).

FIG. 7B illustrates an example in which component P(1) which is sucked by suction nozzle 8*b* is pitch fed to the downstream side from the center of opening 28 ($\Delta L2 > \Delta L1$), and tape feed positional correction is necessary. Opening 28 is formed in consideration of the maximum size of components P to be supplied and the maximum pitch Lp of pockets 13b. Therefore, in a case in which the size of components P and pitch Lp of pockets 13b are small, there is a case in which, in addition to component P(1) which is in suction position C, component P(2) which is the following suction target adjacent on the upstream side is also exposed from opening 28. If the following component P(2) is exposed from opening 28, there is a case in which component P(2) falls out from pocket 13b in which component P(2) is held when component P(1) is sucked, and pitch feed position correction becomes necessary.

In FIG. 6, if tape feed positional correction is determined to be necessary (Yes in ST6), correction amount calculator 46 calculates positional correction amount 51a for correcting the tape feed position (ST7). Positional correction amount 51a is set such that it is possible to prevent the following component P(2) from falling out by retaining component P(2) using tape retaining cover 26, and it is possible to suck the suction target component P(1). In other words, based on the recognition results of board recognition camera 11 (the recognition camera), positional correction amount 51a is a tape feed positional correction amount for positioning the suction target component P(1) at suction position C such that component P(2), which is adjacent on the upstream side in the tape feed direction to component P(1) which is positioned at suction position C, is not exposed by greater than or equal to a predetermined amount from opening 28 (the opening).

In this manner, in a case in which the fact that carrier tape 13 which is supplied from tape feeder 5 is switched to the following carrier tape 13 is detected, correction amount calculator 46 calculates the tape feed positional correction amount (positional correction amount 51a). In a case in which the type of component P which is supplied from tape feeder 5 is a component which is smaller than the predetermined size, correction amount calculator 46 calculates the tape feed positional correction amount (positional correction amount 51a). The post-correction tape feed position is set to a position at which half or more of component P(2) is under tape retaining cover 26, in other words, a position at which the amount by which component P(2) is exposed from opening 28 is less than half the size of component P(2).

The calculated positional correction amount 51a is stored in feeder storage unit 51 of tape feeder 5 for which the tape feed positional correction is necessary. Next, tape feed position corrector 52 of tape feeder 5 controls drive mechanism 25 based on positional correction amount 51a (the tape feed positional correction amount) which is stored in feeder storage unit 51 to rotationally drive sprocket 24 and cause tape feeding to be performed such that the tape feed position is corrected (ST8). In other words, drive mechanism 25 (sprocket drive means) rotationally drives sprocket 24 to cause the tape feeding to be performed based on positional correction amount 51a (the tape feed positional correction amount).

FIG. 7C illustrates an example after the tape feed positional correction. In FIG. 7C, carrier tape 13 is fed by tape feed amount La to the upstream side in comparison to the pre-correction position, and the tape feed positional correction is performed such that the exposure amount of the following component P(2) from opening 28 is less than half the tape feed direction width of component P(2). In this manner, based on the recognition results of board recognition camera 11 (the recognition camera), tape feed position corrector 52 performs the tape feed positional correction for positioning the suction target component P(1) at suction position C such that component P(2), which is adjacent on the upstream side in the tape feed direction to component P(1) which is positioned at suction position C, is not exposed by greater than or equal to a predetermined amount from opening 28 (the opening).

Tape feed position corrector 52 may take tape feed amount La into account to perform the tape feed positional correction and the tape feeding from when, without performing tape feeding in the reverse direction to the upstream side by tape feed amount La, component P(1) is sucked as it is, and the tape feeding is performed to the downstream side using the following component P(2) as the suction target. In this case, although a concern that only component P(2) will fall out from pocket 13b remains, it is possible to reduce the cycle time (time loss) as a result. In ST8, when tape feed positional correction is performed, thereafter, the ordinary component mounting work in which carrier tape 13 is fed by pitch Lp at a time is continued. In ST6, in a case in which tape feed positional correction is determined to be unnecessary (No), the ordinary component mounting work is continued.

In this manner, in a case in which it is detected that carrier tape 13 which is supplied from tape feeder 5 is switched to the following carrier tape 13, tape feed position corrector 52 performs the tape feed positional correction. In a case in which it is determined that the type of component P which is supplied from tape feeder 5 is a smaller component than the predetermined size based on the results obtained by component type identifier 44 identifying the type of component P which is supplied from tape feeder 5, tape feed position corrector 52 executes the tape feed positional correction process.

As described above, in the component mounting method of the exemplary embodiment, recognition mark M which is formed on tape retaining cover 26 which retains carrier tape 13, which holds components P in pockets 13b, toward sprocket 24 with which tape feeder 5 is provided, and component P or pocket 13b which is positioned at suction position C through the opening (opening 28) which is formed in tape retaining cover 26 are recognized. Based on the recognition results, tape feed positional correction for positioning the suction target component P at suction position C is performed such that component P, which is adjacent on the upstream side in the tape feed direction to component P which is positioned at suction position C, is not exposed by greater than or equal to a predetermined amount from the opening (opening 28).

Accordingly, it is possible to prevent component P following component P which is positioned at suction position C from being exposed from opening 28 and falling out.

The component mounter and the component mounting method of the present disclosure have an effect of being capable of preventing the next component after the component which is positioned at the suction position from being exposed from the opening and falling out, and are applicable to a component mounting field in which components are mounted onto a board.

What is claimed is:

1. A component system which includes a feeder and a component mounter and which feeds a carrier tape having components held in pockets along a tape transport path and mounts components onto a mounting target, the component system comprising:

a main body on which the carrier tape travels;

a sprocket operatively associated with the main body and a drive mechanism which feeds the carrier tape along the tape transport path;

a mounting head operatively associated with the carrier tape which picks up the components from the pockets in the carrier tape fed by the sprocket and mounts the components onto the mounting target;

a tape retaining cover operatively associated with the main body which retains the carrier tape fed by the sprocket in the tape transport path from above, and has an opening through which the mounting head picks up the components from the pockets in the carrier tape at a suction position, wherein a recognition mark is provided on a top surface of the tape retaining cover for recognizing the suction position of the components;

a recognition camera which recognizes the recognition mark and the components or the pockets positioned at the suction position through the opening; and a tape feed position corrector operatively associated with the drive mechanism which, based on recognition results of the recognition camera, performs tape feed positional correction in which the sprocket feeds the carrier tape backward to correct a position of one of the components such that another one of the components, which is adjacent to the one of the components on an upstream side along the tape transport path, is not exposed from the opening by an amount greater than or equal to a predetermined amount.

2. The component system of claim 1,
wherein the tape feed position corrector performs the tape feed positional correction in a case in which a type of the components which are supplied from the tape feeder is a type having a smaller size than a maximum size at which tape feed positional correction is necessary.

3. The component system of claim 2, further comprising:
a component type identifier operatively associated with the tape feed position corrector which identifies the type of the components which are supplied from the tape feeder.

4. The component system of claim 1,
wherein the tape feed position corrector performs the tape feed positional correction in a case in which the carrier tape, which is supplied from the tape feeder, being switched is detected.

* * * * *